United States Patent
Katsurai et al.

(10) Patent No.: US 12,160,211 B2
(45) Date of Patent: Dec. 3, 2024

(54) TRANSIMPEDANCE AMPLIFIER

(71) Applicant: Nippon Telegraph and Telephone Corporation, Tokyo (JP)

(72) Inventors: Hiroaki Katsurai, Musashino (JP); Kimikazu Sano, Musashino (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 541 days.

(21) Appl. No.: 17/607,298

(22) PCT Filed: May 8, 2019

(86) PCT No.: PCT/JP2019/018457
§ 371 (c)(1),
(2) Date: Oct. 28, 2021

(87) PCT Pub. No.: WO2020/225892
PCT Pub. Date: Nov. 12, 2020

(65) Prior Publication Data
US 2022/0224298 A1 Jul. 14, 2022

(51) Int. Cl.
*H03F 3/08* (2006.01)
*H03F 3/45* (2006.01)

(52) U.S. Cl.
CPC ... *H03F 3/45475* (2013.01); *H03F 2200/168* (2013.01)

(58) Field of Classification Search
CPC ........................................... H03F 3/08
USPC ...................... 330/308; 250/214 A
See application file for complete search history.

(56) References Cited

U.S. PATENT DOCUMENTS

| | | | | |
|---|---|---|---|---|
| 4,740,687 A | * | 4/1988 | Kiyohara | H03K 17/7955 250/214 R |
| 5,322,995 A | * | 6/1994 | Ohkawa | H03F 3/082 327/345 |
| 5,325,073 A | * | 6/1994 | Hasegawa | H03F 3/08 330/85 |
| 6,246,282 B1 | * | 6/2001 | Oono | H03G 3/3084 330/308 |
| 8,179,200 B2 | * | 5/2012 | Jahana | H03F 3/087 330/109 |
| 2002/0063937 A1 | | 5/2002 | Kikuchi | |
| 2009/0051442 A1 | * | 2/2009 | Seo | H03F 3/087 330/308 |

(Continued)

FOREIGN PATENT DOCUMENTS

| | | |
|---|---|---|
| JP | 2000-151290 A | 5/2000 |
| JP | 2002-164855 A | 6/2002 |

(Continued)

OTHER PUBLICATIONS

Xin Yin, et al., *Experiments on 10 GB/s Fast Settling High Sensitivity Burst-Mode Receiver with On-Chip Auto-Reset for 10G-GPONs*, OFC/NFOEC Technical Digest, 2012, NTu1J.4, pp. 1-4.

*Primary Examiner* — Henry Choe
(74) *Attorney, Agent, or Firm* — Workman Nydegger

(57) ABSTRACT

A reset signal is generated by a TIA circuit alone. In an embodiment, a transimpedance amplifier configured to convert a current signal into a voltage signal includes a transimpedance stage including an amplification stage constituted of a transistor with a grounded emitter, and a comparator configured to compare a collector voltage of the transistor with a reference voltage and output a reset signal.

6 Claims, 10 Drawing Sheets

(56) References Cited

U.S. PATENT DOCUMENTS

| | | | |
|---|---|---|---|
| 2010/0231295 A1* | 9/2010 | Hara | H03F 3/72 330/185 |
| 2011/0129235 A1 | 6/2011 | Le et al. | |
| 2013/0342275 A1* | 12/2013 | Takemoto | H03F 3/45744 330/254 |
| 2017/0294970 A1 | 10/2017 | Mita | |

FOREIGN PATENT DOCUMENTS

| | | |
|---|---|---|
| JP | 2008-148321 A | 6/2008 |
| JP | 2009-33627 A | 2/2009 |
| WO | 2016/035374 A1 | 3/2016 |

* cited by examiner

TRANSIMPEDANCE AMPLIFIER

TECHNICAL FIELD

The present disclosure relates to a transimpedance amplifier, for example, a transimpedance amplifier that is used in a optical receiver and converts and amplifies a current signal into a voltage signal.

BACKGROUND ART

In a optical receiver used for optical communications, typically, an optical signal is converted into a current signal by a light receiving element such as a photo diode (hereinafter abbreviated as PD); thereafter, the current signal is converted into a voltage signal and the signal intensity is amplified by an electrical amplifier represented by a transimpedance amplifier (hereinafter referred to as a TIA). Among the TIAs, a TIA applied to a passive optical network (PON) used in fiber to the home (FTTH) or the like is referred to as a burst TIA (BTIA). The BTIA is required to respond to optical signals having intensity differences and being intermittent, that is burst optical signals, at high speed and convert the burst optical signals into voltage signals. It is a problem of the BTIA to manage response performance and consecutive identical code tolerance at the same time.

In a optical receiver, in order to receive optical signals having intensity differences, the gain of an amplifier needs to be variable to widen a dynamic range as the amplifier. Furthermore, in order to output a correct waveform as a differential signal, an offset voltage or a threshold voltage inside a circuit needs to be changed in accordance with the intensity of an input signal.

FIG. 1 illustrates a circuit configuration of a BTIA equipped with an AGC and an AOC of an example of related art. In a BTIA 10, a transimpedance stage 11 configured to convert a current signal Iin, which is converted by a light receiving element PD, into a voltage signal, an intermediate buffer 12, and an output buffer 13 are connected in sequence. In the transimpedance stage 11, the gain is adjusted by an automatic gain control circuit (hereinafter, referred to as an AGC) 14 in such a manner that the output is not distorted even when a high intensity optical signal is received. Between the transimpedance stage 11 and the intermediate buffer 12, an automatic offset control circuit (hereinafter, referred to as an AOC) 15 is interposed to adjust the offset in accordance with the intensity of the input signal. In the BTIA, the response speed is determined by time constants of the two control circuits.

When each of the time constants is small, it is possible to achieve a high speed response. On the other hand, since a burst optical signal to be received is a data signal, various patterns are included therein, and a pattern in which an identical code appears in succession is also present. When the time constant is small, the gain or the offset voltage is changed depending on the length of the pattern in the successive state, which may cause a code error to occur.

Thus, as one of the BTIA schemes, a reset signal is generated to distinguish between a burst period in which a burst optical signal is received and a no-signal period in which there is no burst optical signal, thereby changing the time constant. At a leading portion of the burst optical signal, the time constant is made small by detecting the reset signal to achieve a high speed response, and during the burst period, the time constant is made large to enhance the consecutive identical code tolerance.

FIG. 2 illustrates a configuration of a receiver of related art configured to be inputted with a reset signal from the outside. Illustrated is a configuration of a line card of an optical line terminal (OLT) installed on a station side in a PON. In the line card 20, an OLT transceiver 22 connected to an optical fiber 21, a clock and data recovery (CDR) circuit 23, and a control LSI (MAC-LSI) 24 are connected in sequence. In the PON, the timing at which each of optical network units (ONUs) on a subscriber side transmits data is assigned by the optical line terminal (OLT) on the station side. From this, it is possible for the control LSI (MAC-LSI) of the OLT to generate a reset signal.

However, since the CDR circuit 23 is present between the OLT transceiver 22, in which a BTIA is mounted, and the MAC-LSI 24, the reset signal needs to be wired in the form of bypassing the CDR circuit 23. The MAC-LSI 24 needs to be equipped with a circuit for generating the reset signal and needs to be designed integrally including the wiring inside the line card 20, which brings about poor versatility. In addition, the OLT transceiver 22 is typically configured so as to be inserted and extracted, and therefore it is undesirable to become a non-compatible dedicated product.

Thus, a method for producing a reset signal at only the optical receiver side without using the reset signal from the MAC-LSI is known. For example, in a burst mode optical receiver of Non Patent Literature 1, the end of a burst signal is detected by counting a signal pattern immediately before the final output stage of a limiting amp (LA). In addition, a common potential of a differential input portion of the LA is changed in a no-signal period between burst periods by combining a circuit configured to detect the presence or absence of data. The BTIA generates a reset signal to change a time constant of the BTIA by detecting a change in common potential of a differential output portion of an output buffer to be connected to the LA.

The OLT transceiver is a component able to be inserted and extracted on the line card, and therefore it is undesirable to become a dedicated product. The BTIA also becomes a component integrated with a PD, which is called a receiver optical subassembly (ROSA), and is mounted on the OLT transceiver. Therefore, the scheme in which the dedicated TIA and the LA are combined as described in Non Patent Literature 1 is poor in compatibility and undesirable. Furthermore, there exists a problem that a circuit to count data signals is needed inside the LA, thereby increasing power consumption and the circuit area.

CITATION LIST

Non Patent Literature

Non Patent Literature 1: Xin Yin, et al., "Experiments on 10 Gb/s Fast Settling High Sensitivity Burst-Mode Receiver with On-Chip Auto-Reset for 10G-G PONs", OFC/NFOEC Technical Digest, 2012, NTuIJ.4.

SUMMARY OF THE INVENTION

An object of the present disclosure is to achieve a reset signal generated by a TIA circuit alone.

In order to accomplish the above object, in an embodiment of the present disclosure, a transimpedance amplifier configured to convert a current signal into a voltage signal includes a transimpedance stage including an amplification stage constituted of a transistor with a grounded emitter, and a comparator configured to compare a collector voltage of the transistor with a reference voltage and output a reset signal.

DESCRIPTION OF EMBODIMENTS

Hereinafter, embodiments of the present disclosure will be described in detail with reference to the drawings.

First Embodiment

Figure 1:
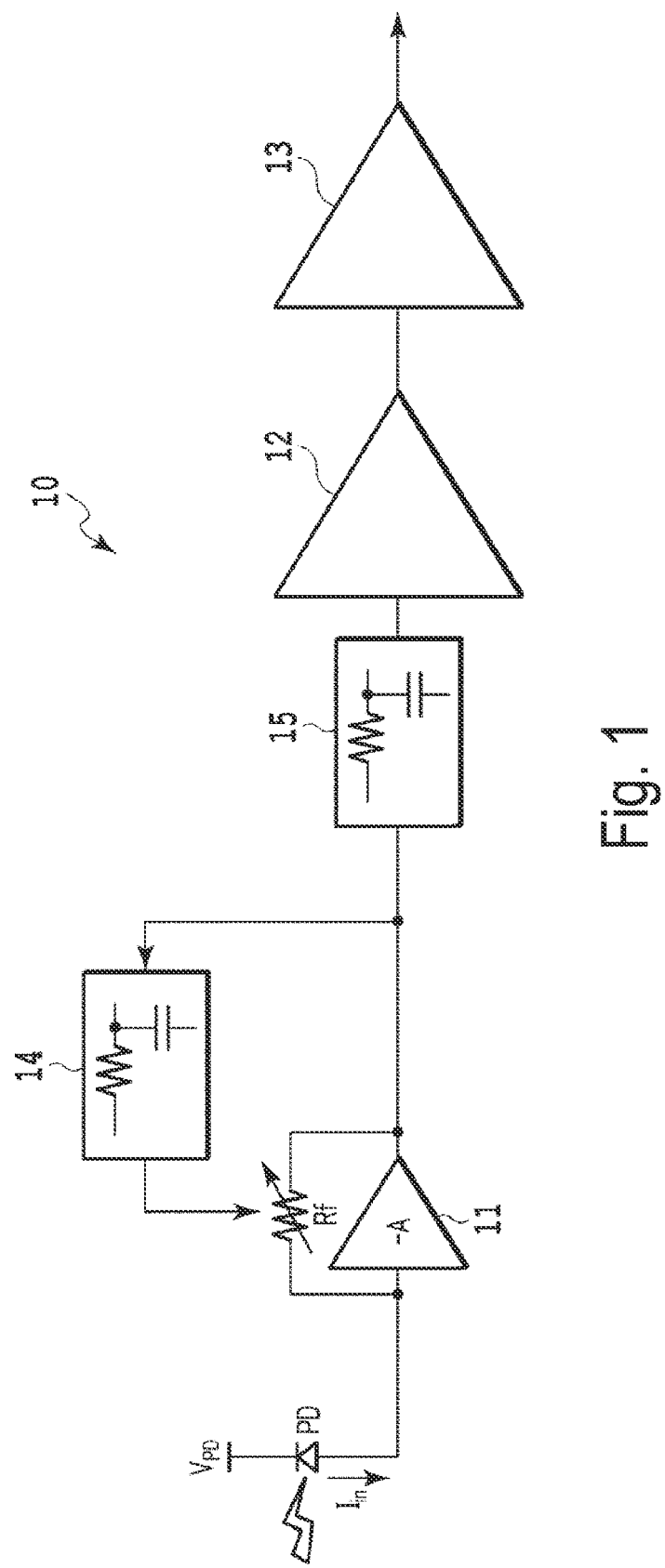
FIG. 1 illustrates a circuit configuration of a BTIA equipped with an AGC and an AOC of related art.
Figure 2:
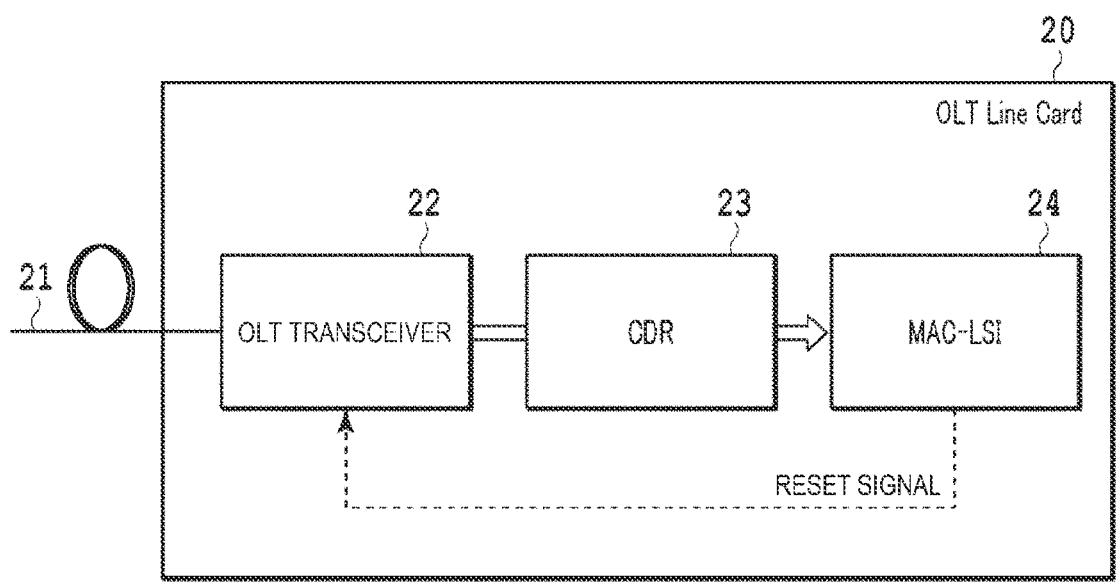
FIG. 2 illustrates a configuration of a receiver of related art configured to be inputted with a reset signal from the outside.
Figure 3:
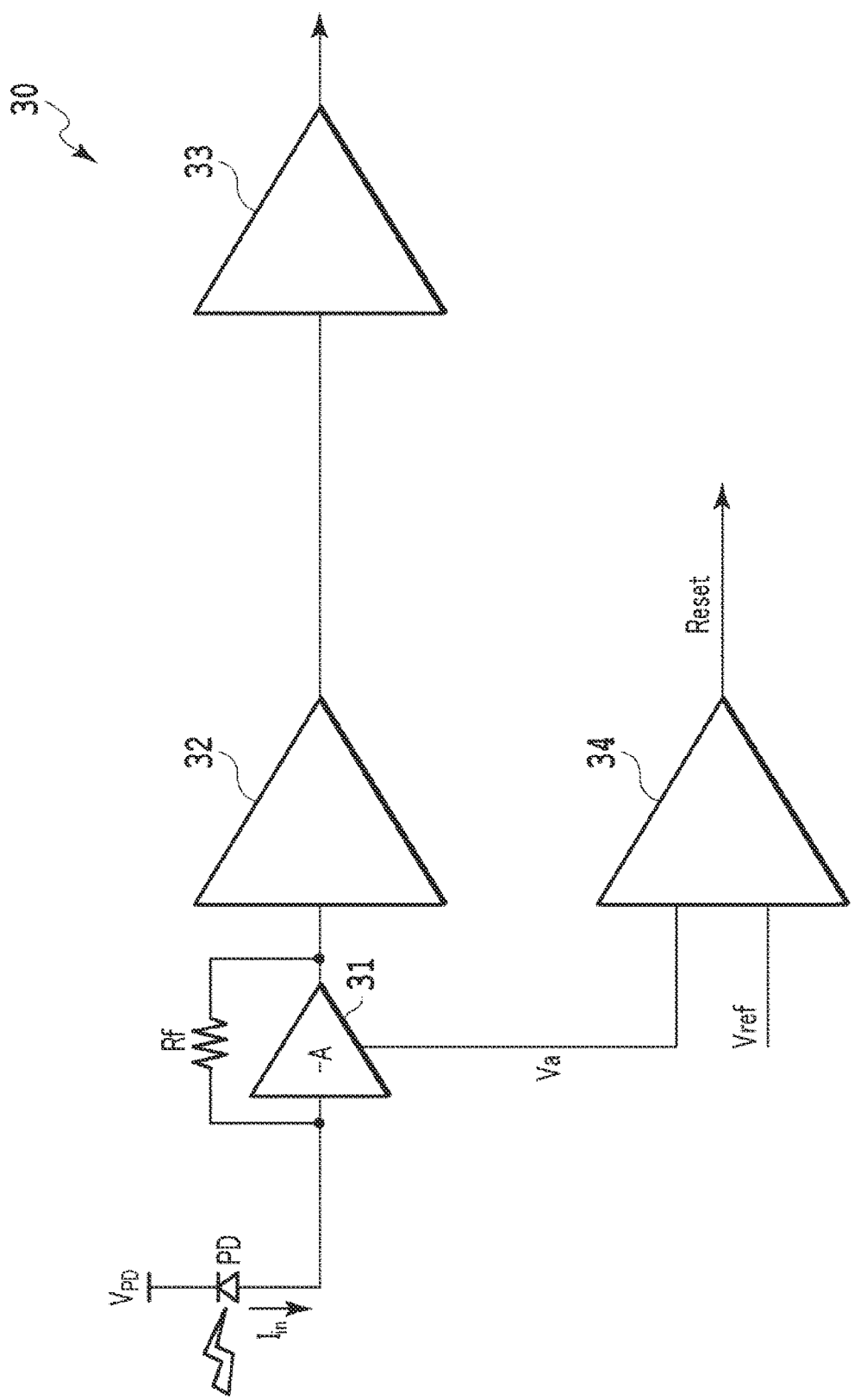
FIG. 3 is a diagram illustrating a circuit configuration of a BTIA according to a first embodiment of the present disclosure.

FIG. 3 illustrates a circuit configuration of a BTIA according to a first embodiment of the present disclosure. A BTIA 30 includes a PD configured to receive an optical signal, a transimpedance stage 31, whose input terminal is connected with an anode terminal of the PD, an intermediate buffer 32 connected to an output terminal of the transimpedance stage 31, and an output buffer 33 connected to an output terminal of the intermediate buffer 32, where output of the output buffer 33 is output of the BTIA 30. In addition, there is included a comparator 34 configured to compare a voltage value Va taken out from a node A, which will be described later, of the transimpedance stage 31, with a reference voltage Vref, and output a reset signal (Reset).

Figure 4:
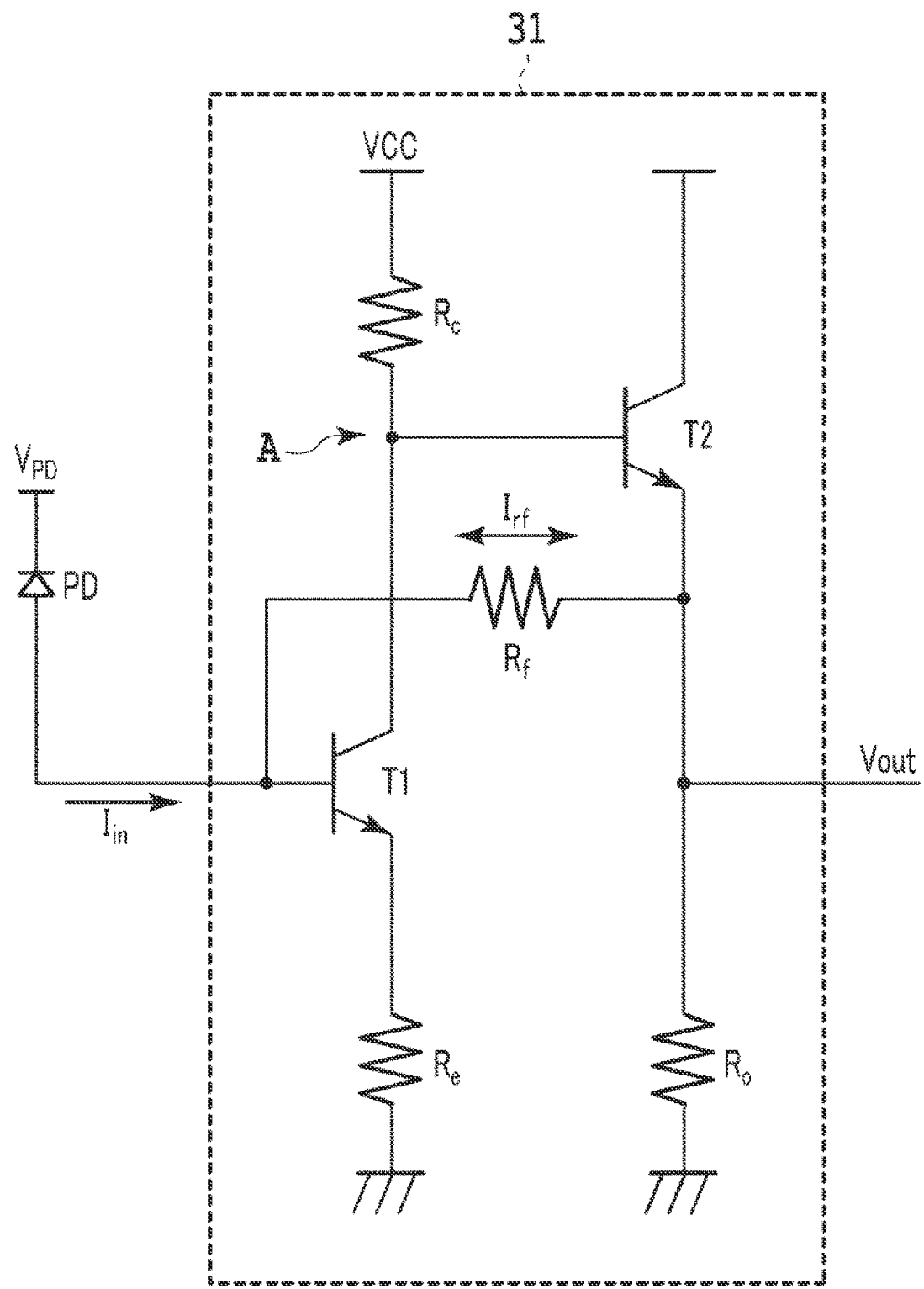
FIG. 4 is a diagram illustrating a circuit configuration of a transimpedance stage of the BTIA of the first embodiment.

FIG. 4 illustrates a circuit configuration of the transimpedance stage of the BTIA of the first embodiment. The transimpedance stage 31 has a configuration of an inverting amplifier, and includes an amplification stage constituted of a transistor T1 with a grounded emitter and resistors Rc and Re, and an output stage constituted of a transistor T2 and a resistor Ro. As an input signal current Iin increases, an output signal voltage Vout is lowered. This is because the input signal current Iin flows through a feedback resistor Rf, thereby causing a voltage drop. In accordance with the magnitude of the input signal current Iin, the magnitude of an output signal voltage amplitude Voutpp varies as represented by the following equation.

$$Voutpp = Rf \cdot Irf$$

When the collector side of the transistor T1 is taken as the node A, as the input signal current Iin increases in a similar manner, a voltage Va of the node A is lowered accordingly.

Figure 5:
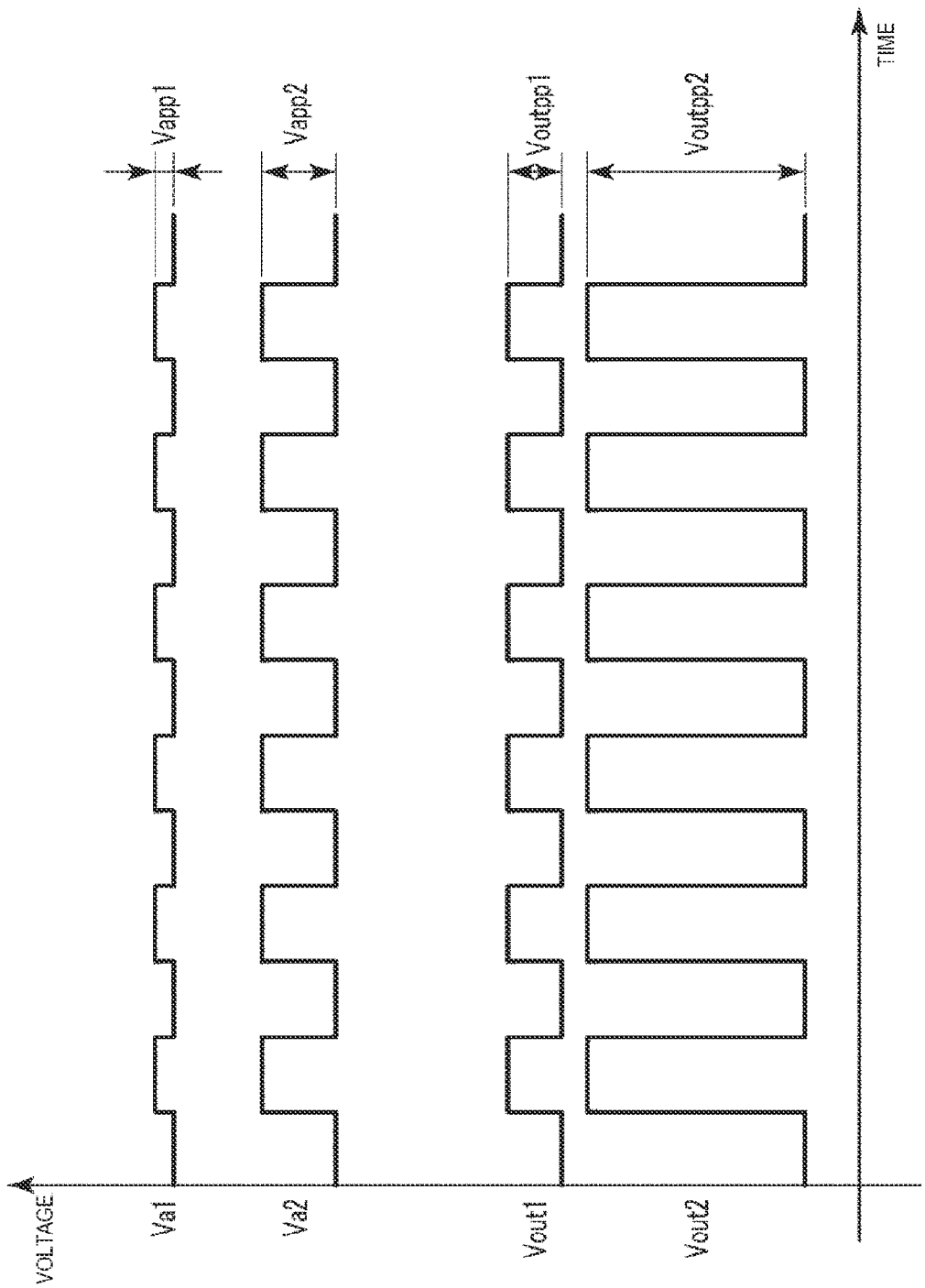
FIG. 5 is a diagram illustrating changes in internal voltages of the BTIA of the first embodiment.

FIG. 5 illustrates change in internal voltages of the BTIA of the first embodiment. Changes in Va1 and Vout1 when the input signal current Iin is small, and changes in Va2 and Vout2 when the input signal current Iin is large are depicted together. When focusing on DC components, a difference between the voltages Va and Vout is determined by Vbe of the transistor T2 and is substantially constant. As for AC components, due to an effect of negative feedback of the emitter resistor Re, a voltage amplitude Vapp of Va is small compared to Voutpp.

Figure 6:
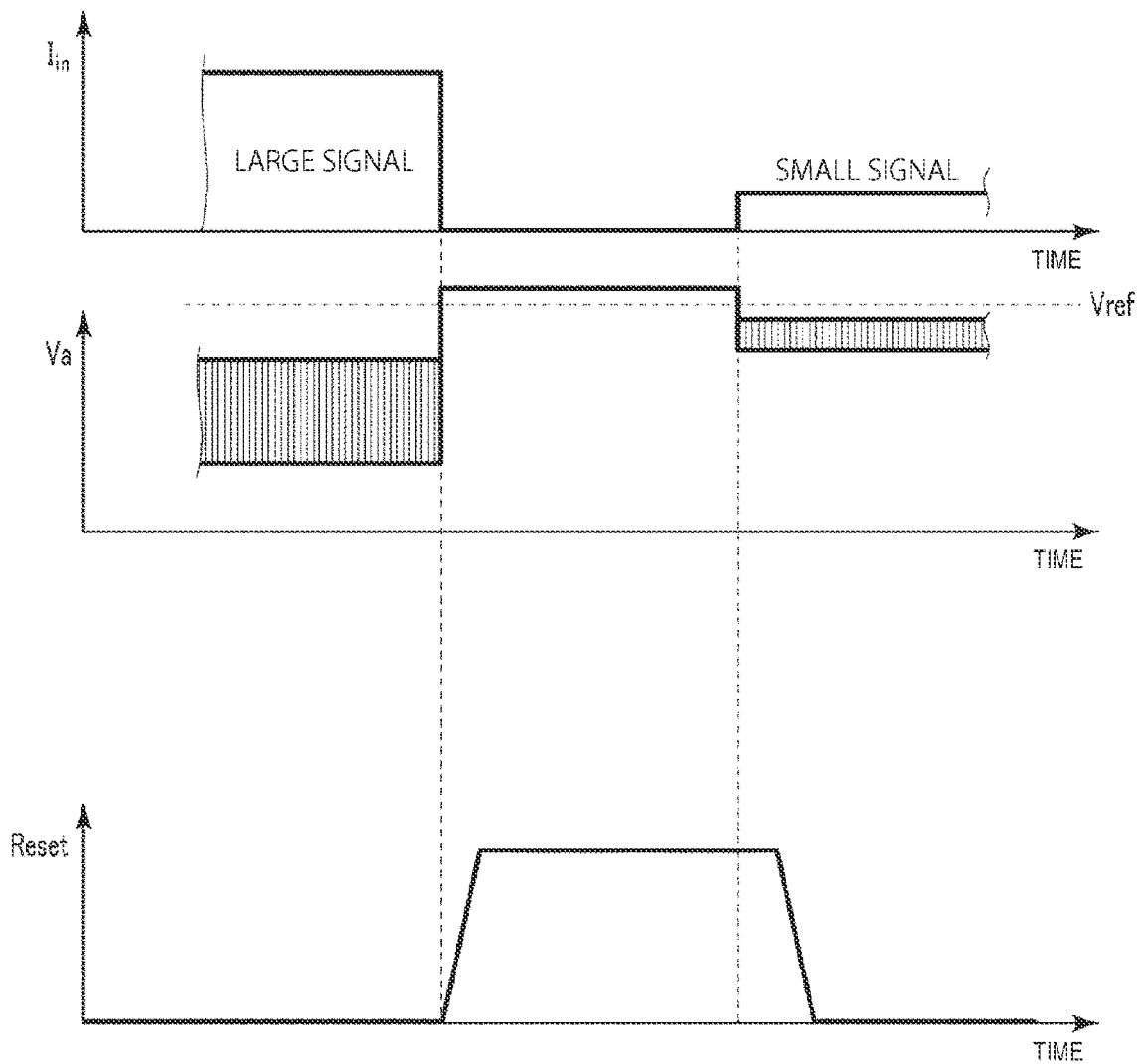
FIG. 6 is a diagram illustrating a timing chart of the BTIA of the first embodiment.

FIG. 6 illustrates a timing chart of the BTIA of the first embodiment. As described above, the voltages of Va and Vout in the no-signal period are highest, and as the input signal current Iin during the burst period increases, the voltages thereof are lowered. Then, as illustrated in FIG. 3, the voltage Va of the transimpedance stage 31 and the reference voltage Vref are compared by the comparator 34. Setting the reference voltage Vref appropriately makes it possible to detect a no-signal period, that is, a period in which the input signal current Iin is zero, as illustrated in FIG. 6. A reset signal is output when Va is greater than Vref. Note that the reference voltage Vref may be generated inside the circuit, or may be input from the outside.

As illustrated in FIG. 6, there is a constant delay in the output of the comparator 34, so that the reset signal is generated in such a manner as to extend to the leading portion of a burst signal in proportion to the delay. Accordingly, by making the time constant small when a burst period is ended and the reset signal is detected, the time constant is small at the initial time when the transition from a no-signal period to a burst period is made again, so that the AGC and AOC respond at high speed, thereby shortening the response time.

Second Embodiment

Figure 7:
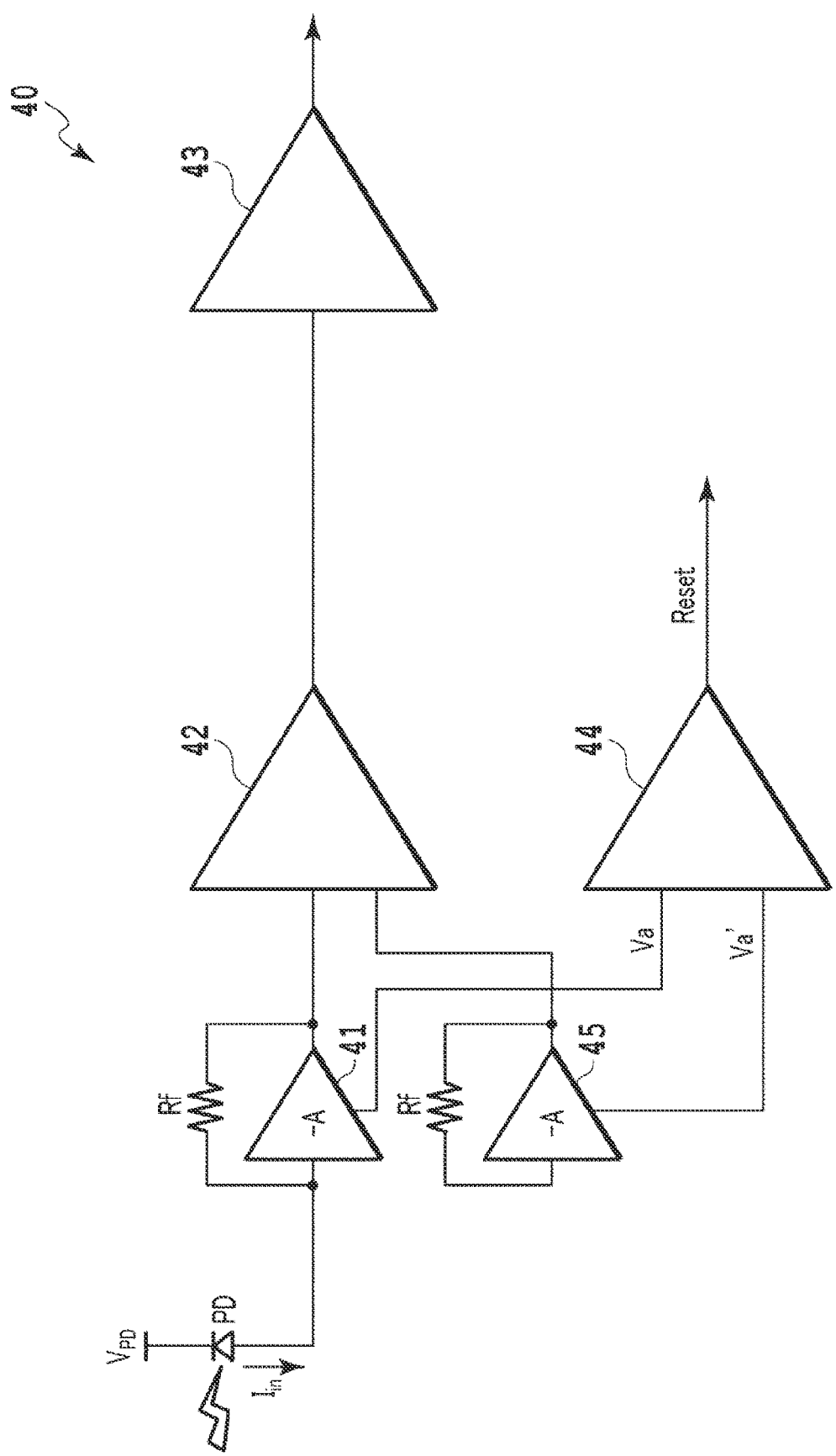
FIG. 7 is a diagram illustrating a circuit configuration of a BTIA according to a second embodiment of the present disclosure.

FIG. 7 illustrates a circuit configuration of a BTIA according to a second embodiment of the present disclosure. A BTIA 40 includes a PD configured to receive an optical signal, a transimpedance stage 41, whose input terminal is connected with an anode terminal of the PD, an intermediate buffer 42 connected to an output terminal of the transimpedance stage 41, and an output buffer 43 connected to an output terminal of the intermediate buffer 42, where output of the output buffer 43 is output of the BTIA 40. In addition, there is included a comparator 44 configured to compare a voltage value Va taken out from a node A of the transimpedance stage 41, with a voltage value Va' taken out from a node A' of a dummy TIA 45 as a reference voltage, and output a reset signal (Reset).

Typically, in the BTIA, the circuit form is converted from single amplification to differential amplification inside the circuit. Then, the intermediate buffer 42 serves as a differential amplifier, and the dummy TIA 45 and the transimpedance stage 41 are connected to differential inputs thereof. The dummy TIA 45 and the transimpedance stage 41 have the same circuit configuration and same circuit constants, thereby making it possible to output appropriate bias voltages following the transimpedance stage 41 even when the process, temperature, power supply voltage, or the like changes. The collector side of the emitter-grounded transistor of the dummy TIA 45 is taken as the node A'. Since an input signal current as the input to the dummy TIA 45 is always zero, by comparing the voltage Va' of the node A' with the voltage Va, it is possible to appropriately detect a no-signal period even when the process, temperature, power supply voltage, or the like changes.

Third Embodiment

Figure 8:
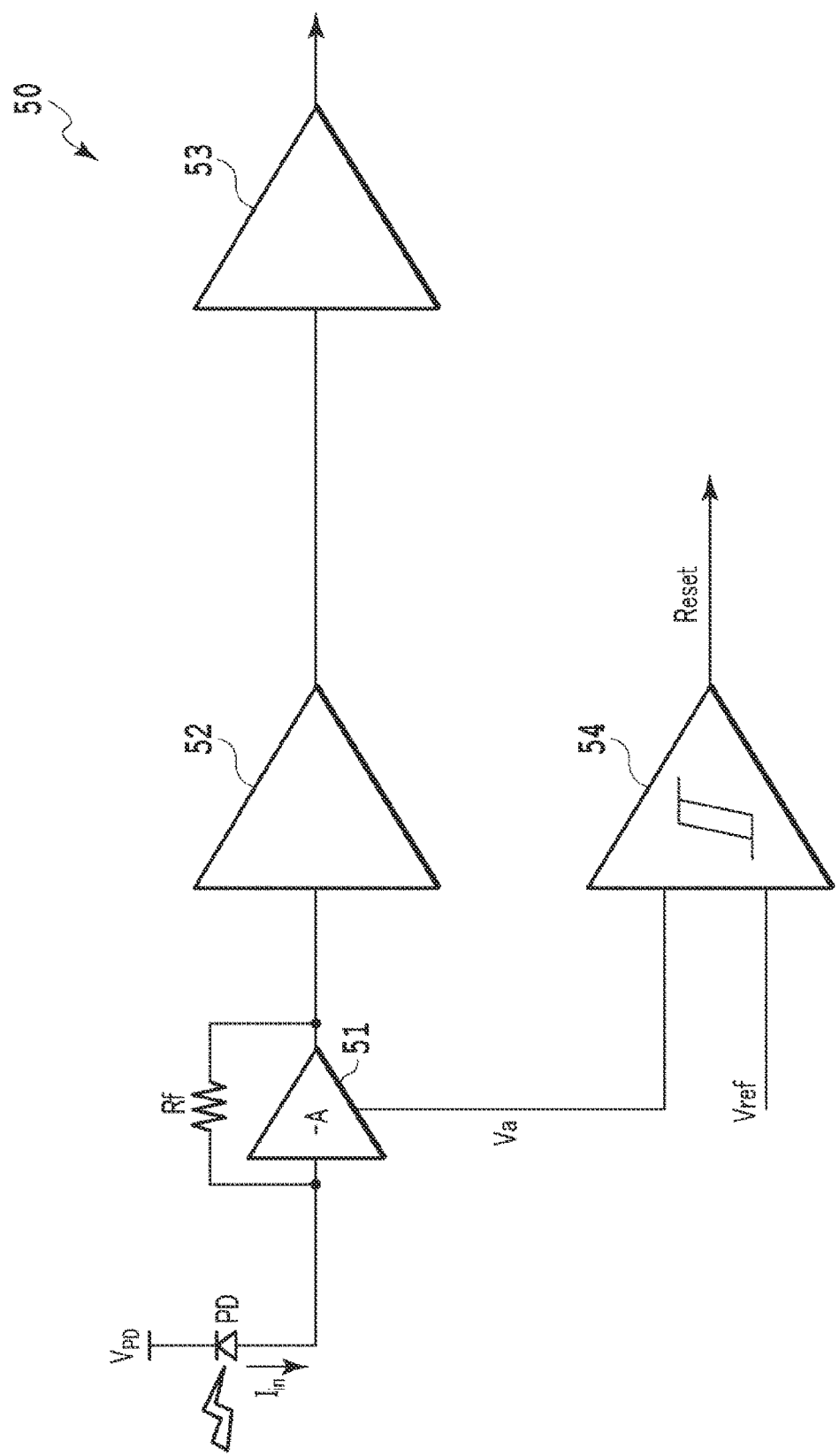
FIG. 8 is a diagram illustrating a circuit configuration of a BTIA according to a third embodiment of the present disclosure.

FIG. 8 illustrates a circuit configuration of a BTIA according to a third embodiment of the present disclosure. A BTIA 50 includes a PD configured to receive an optical signal, a transimpedance stage 51, whose input terminal is connected with an anode terminal of the PD, an intermediate buffer 52 connected to an output terminal of the transimpedance stage 51, and an output buffer 53 connected to an output terminal of the intermediate buffer 52, where output of the output buffer 53 is output of the BTIA 50. In addition, there is included a hysteresis comparator 54 configured to compare a voltage value Va taken out from a node A of the transimpedance stage 51 with a reference voltage Vref, and output a reset signal (Reset).

As illustrated in FIG. 6, the voltage Va of the node A is affected by AC components of an input signal current Iin, and fluctuates up and down to a certain degree even at the time of a small signal. Because of this, the reference voltage Vref needs to be set in consideration of the fluctuation width. However, when the gain of the transimpedance stage 51 is small, a difference between a case of the input signal current Iin being zero and a small signal, which makes it difficult to set the reference voltage Vref with accuracy. Even in the case where the input signal current Iin is zero, a fluctuation caused by noise may not be prevented from occurring.

Then, by replacing the comparator in the BTIA of the above-described embodiment with the hysteresis comparator, when the voltage Va of the node A comes close to the reference voltage Vref, the output of the comparator is prevented from being frequently varied due to noise mixed in the input voltage.

Fourth Embodiment

Figure 9:
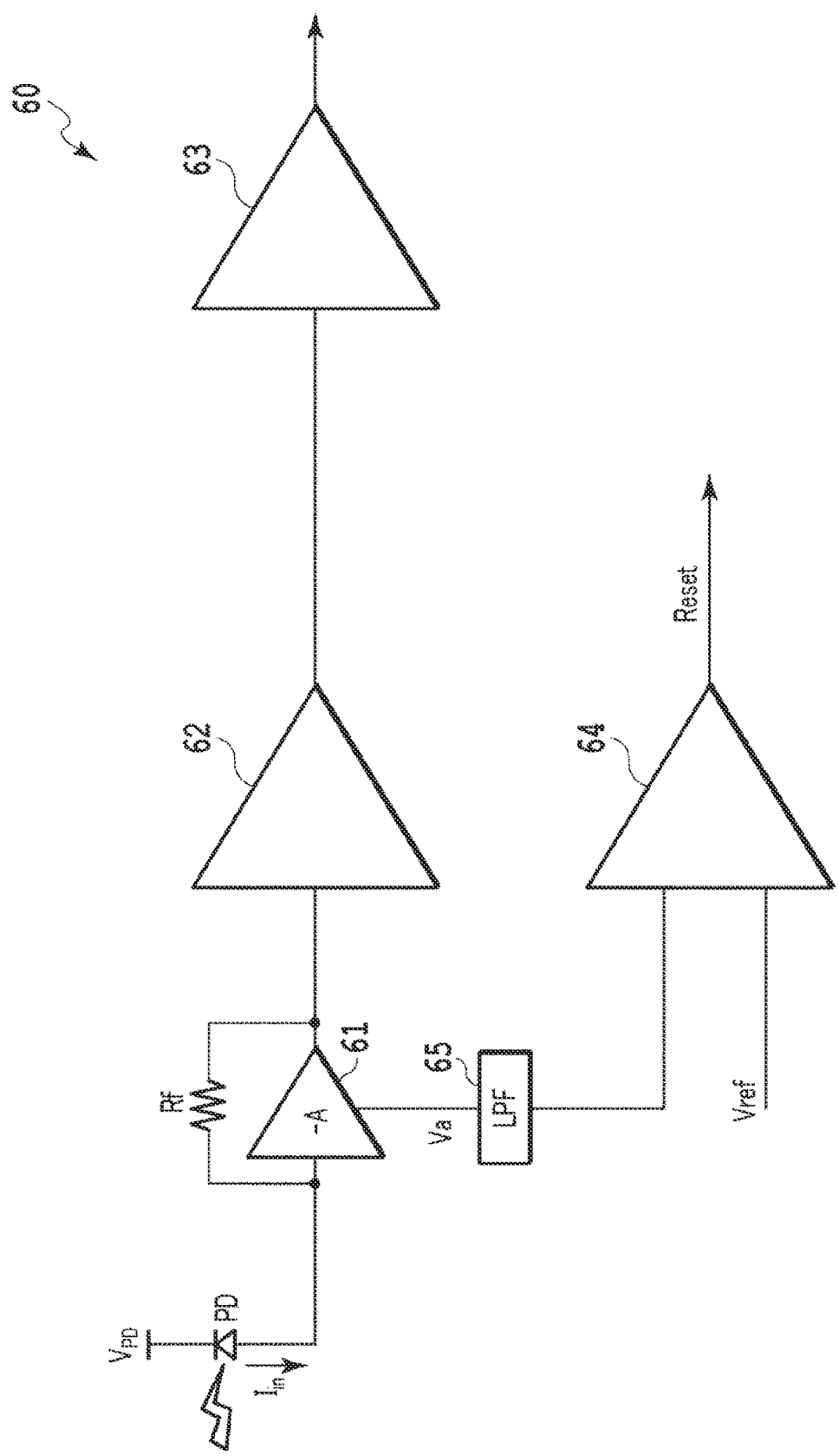
FIG. 9 is a diagram illustrating a circuit configuration of a BTIA according to a fourth embodiment of the present disclosure.

FIG. 9 illustrates a circuit configuration of a BTIA according to a fourth embodiment of the present disclosure. A BTIA 60 includes a PD configured to receive an optical signal, a transimpedance stage 61, whose input terminal is connected with an anode terminal of the PD, an intermediate buffer 62 connected to an output terminal of the transimpedance stage 61, and an output buffer 63 connected to an output terminal of the intermediate buffer 62, where output of the output buffer 63 is output of the BTIA 60. There is further included a comparator 64 configured to compare a voltage value Va taken out from a node A, which will be described below, of the transimpedance stage 61, with a reference voltage Vref, and output a reset signal (Reset); in addition, a low pass filter (LPF) 65 is interposed between the transimpedance stage 61 and the comparator 64.

As illustrated in FIG. 6, the voltage Va of the node A is affected by AC components of an input signal current Iin, and fluctuates up and down to a certain degree even at the time of a small signal. Such a fluctuation component may become a factor of malfunction of the comparator 64. Then, by interposing the LPF 65 to cut high frequency AC components, stable operation of the comparator 64 is achieved.

Fifth Embodiment

Figure 10:
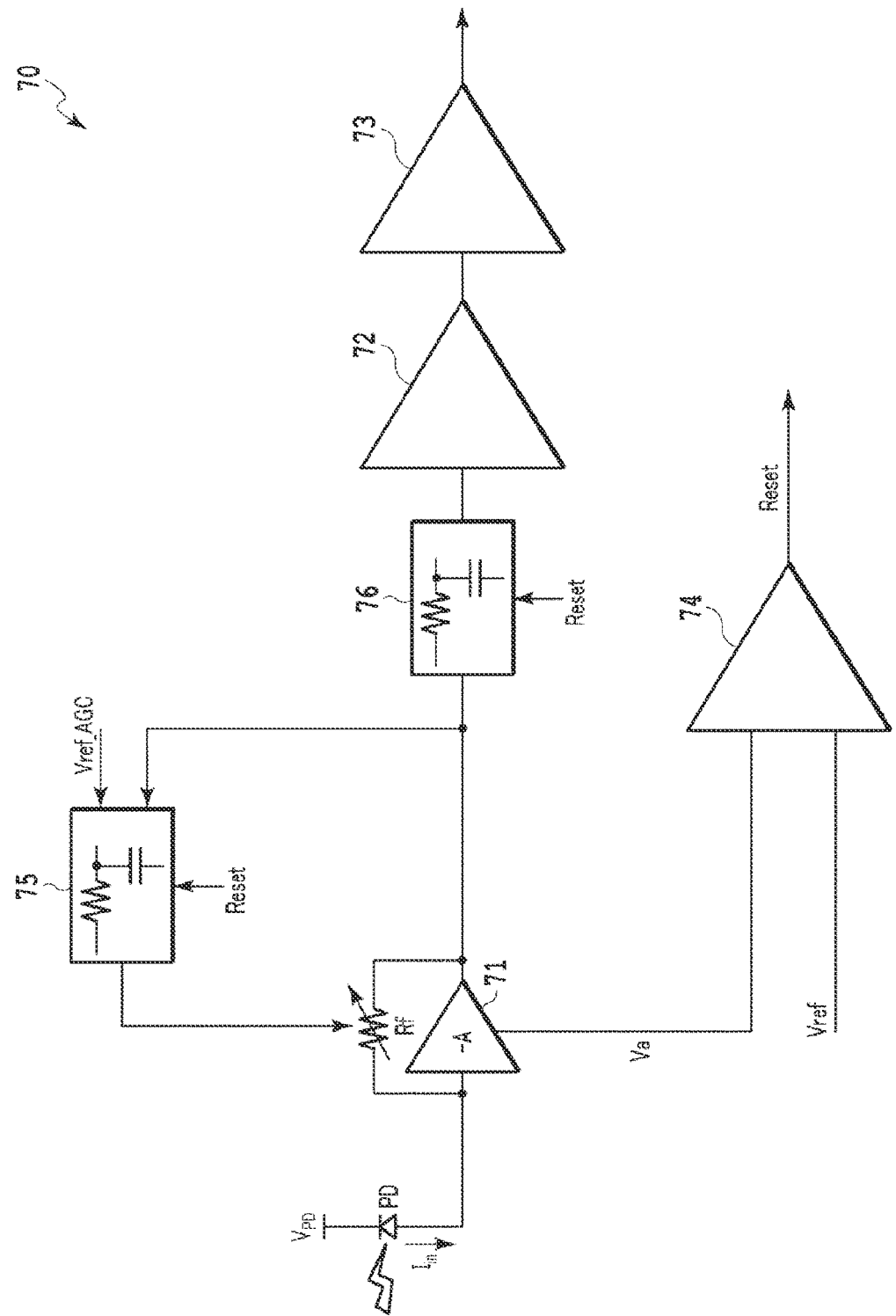
FIG. 10 is a diagram illustrating a circuit configuration of a BTIA according to a fifth embodiment of the present disclosure.

FIG. 10 illustrates a circuit configuration of a BTIA according to a fifth embodiment of the present disclosure. A BTIA 70 includes a PD configured to receive an optical signal, a transimpedance stage 71, whose input terminal is connected with an anode terminal of the PD, an intermediate buffer 72 connected to an output terminal of the transimpedance stage 71, and an output buffer 73 connected to an output terminal of the intermediate buffer 72, where output of the output buffer 73 is output of the BTIA 70. Further, there are included an AGC 75 configured to compare the output of the transimpedance stage 71 with a reference voltage VrefAGC and control the gain of the transimpedance stage 71, and a comparator 74 configured to compare a voltage value Va taken out from a node A of the transimpedance stage 71 with a reference voltage Vref and output a reset signal (Reset).

The reset signal switches time constants of the AGC 75 and an AOC 76. For example, in a case where the time constant is made small when the reset signal is detected, the time constant is small at the initial time when the transition from a no-signal period to a burst period is made again, so that the AGC and AOC may respond at high speed; then, during the burst period, the time constant is made large to enhance the consecutive identical code tolerance.

According to the first to fifth embodiments, in the TIA circuit, by detecting a no-signal period when the light receiving element receives a burst optical signal and generating a reset signal, it is possible to achieve both a high speed response and enhancement of the consecutive identical code tolerance.

The invention claimed is:

1. A transimpedance amplifier configured to convert a current signal into a voltage signal, comprising:
   a transimpedance stage including an amplification stage constituted of a transistor with a grounded emitter;
   a comparator configured to compare a collector voltage of the transistor with a reference voltage and output a reset signal;
   an intermediate buffer including differential inputs, an output of the transimpedance stage being connected to one of the differential inputs; and
   a dummy transimpedance amplifier connected to another of the differential inputs of the intermediate buffer, and having an identical circuit configuration as the transimpedance stage,
   wherein the reference voltage is a collector voltage of the transistor with the grounded emitter in an amplification stage of the dummy transimpedance amplifier.

2. The transimpedance amplifier according to claim 1, wherein the comparator is a hysteresis comparator.

3. The transimpedance amplifier according to claim 1, further comprising a low pass filter (LPF) interposed between the transimpedance stage and the comparator.

4. The transimpedance amplifier according to claim 1, further comprising a gain control circuit configured to switch a time constant by the reset signal and control a gain of the transimpedance stage.

5. The transimpedance amplifier according to claim 1, further comprising an offset control circuit configured to switch a time constant by the reset signal and switch an output offset of the transimpedance stage.

6. A transimpedance amplifier configured to convert a current signal from a light receiving element into a voltage signal, comprising:
   a transimpedance stage including an amplification stage constituted of a transistor with a grounded emitter, an input terminal of the transimpedance stage connected to the light receiving element;

a comparator configured to compare a collector voltage of the transistor with a reference voltage and output a reset signal;
an intermediate buffer including differential inputs an output of the transimpedance stage being connected to one of the differential inputs; and
a dummy transimpedance amplifier connected to another of the differential inputs of the intermediate buffer, and having an identical circuit configuration as the transimpedance stage,
wherein the reference voltage is a collector voltage of the transistor with the grounded emitter in an amplification stage of the dummy transimpedance amplifier, and
the reset signal detects a no-signal period in a case where the light receiving element receives a burst optical signal.

\* \* \* \* \*